United States Patent [19]

Irinoda

[11] Patent Number: 5,726,499
[45] Date of Patent: Mar. 10, 1998

[54] SEMICONDUCTOR DEVICE HAVING A MINUTE CONTACT HOLE

[75] Inventor: Mitsugu Irinoda, Kakogawa, Japan

[73] Assignee: Ricoh Company, Ltd., Tokyo, Japan

[21] Appl. No.: 681,221

[22] Filed: Jul. 22, 1996

[30] Foreign Application Priority Data

Jul. 22, 1995 [JP] Japan ............................. 7-207736
Oct. 13, 1995 [JP] Japan ............................. 7-291888

[51] Int. Cl.$^6$ ............................................. H01L 23/48
[52] U.S. Cl. ....................... 257/774; 257/758; 257/776
[58] Field of Search ............................. 257/774, 776, 257/773, 758

[56] References Cited

U.S. PATENT DOCUMENTS

| 4,502,069 | 2/1985 | Schuh ................................. 257/774 |
| 5,614,765 | 3/1997 | Avanzino et al. .................... 257/774 |

FOREIGN PATENT DOCUMENTS

| 63-260051 | 10/1988 | Japan | ........................ H01L 21/88 |
| 2-303026 | 12/1990 | Japan | ........................ 257/774 |
| 3-239348 | 10/1991 | Japan | ........................ 257/774 |
| 4125925 | 4/1992 | Japan | ........................ H01L 21/302 |
| 4162625 | 6/1992 | Japan | ........................ H01L 21/302 |
| 4206819 | 7/1992 | Japan | ........................ H01L 21/302 |

*Primary Examiner*—Jerome Jackson
*Assistant Examiner*—Nathan K. Kelley
*Attorney, Agent, or Firm*—Cooper & Dunham LLP

[57] ABSTRACT

A contact structure includes a depression formed in an insulation layer covered by an etching resistant layer and a through hole provided in the depression, wherein a ring-shaped wall member is provided on the depression such that the space formed inside the ring-shaped wall member continues to the through hole. The ring-shaped wall member is formed of a material having an etching rate different from the material forming insulation layer or the etching resistant layer.

17 Claims, 13 Drawing Sheets

SEMICONDUCTOR DEVICE HAVING A MINUTE CONTACT HOLE

BACKGROUND OF THE INVENTION

The present invention generally relates to semiconductor devices and more particularly to a contact structure of a semiconductor device for use in miniaturized semiconductor devices such as submicron devices, as well as a semiconductor device that uses such a contact structure. Further, the present invention relates to a contact structure for use in semiconductor integrated circuits having a multilayer interconnection structure and a semiconductor integrated circuit having such a contact structure.

With the development of photolithography, miniaturization of semiconductor devices is continuing. Currently, semiconductor devices having a submicron pattern size are produced successfully by using an advanced photolithographic system. Further, recent semiconductor integrated circuits of a large integration density and hence including a large number of semiconductor devices therein, are increasingly using a multilayer interconnection structure in which wiring or interconnection patterns are provided in plural layers with an interlayer insulation structure intervening therebetween.

When producing such submicron semiconductor devices in the form of integrated circuit, it is necessary to provide minute contact holes of submicron size on an insulation layer having a stepped surface.

FIGS. 1A and 1B show a typical example of forming such a minute contact hole in an insulation layer having a stepped surface.

Referring to FIG. 1A showing a part of a semiconductor integrated circuit, it will be noted that a field oxide film 2 is provided on a semiconductor substrate 1 so as to define an active region that includes a diffusion region 3. On the field oxide film 2, it will be noted that a conductor pattern 4 having a submicron width is provided, wherein the conductor pattern 4 may be a gate pattern of a MOS transistor. In this case, the conductor pattern 4 extends in the direction generally perpendicularly to the sheet of the drawing and forms a gate electrode in an active region not illustrated in FIG. 1A.

The conductor pattern 4 is covered by an insulation film 5 that may include a silicon oxide film deposited on the substrate 1 by a CVD process so as to cover the diffusion region 3 as well as the field oxide film 2 including the conductor pattern, wherein a planarization layer of BPSG or the like, may be provided further on the silicon oxide film to form the foregoing insulation film 5.

In the state of FIG. 1A, a photoresist 6 is applied on the insulation film 5, wherein the photoresist 6 includes openings 6A and 6B formed by a photolithographic process that includes exposure and development of the photoresist 6, such that the surface of the insulation film 5 is exposed at the openings 6A and 6B.

Next, in the step of FIG. 1B, a reactive ion etching process is applied to the structure of FIG. 1A while using the photoresist 6 as a mask, to form contact holes 5A and 5B respectively in correspondence to the openings 6A and 6B of FIG. 1A. The contact holes 5A and 5B thus formed expose the diffusion region 3 and the conductor pattern 4 respectively, and the structure of FIG. 1B is ready for formation of a wiring pattern thereon for interconnecting various parts of the semiconductor devices formed on the substrate 1.

In such a process, it should be noted that, because of the existence of stepped structure on the part of the insulation layer 5 covering the conductor pattern 4, which in turn is located on the field oxide film 2, there is a tendency that the photoresist 6 has a reduced thickness $t_2$ in the region immediately above the conductor pattern 4 where the opening 6B is formed, as compared with a thickness $t_1$ for the part of the photoresist 6 located above the diffusion region 3 on which the opening 6A is formed. Further, associated with the reduced thickness of the photoresist 6 on the part located above the conductor pattern 4, the insulation film 5 also has a reduced thickness in the part covering the conductor pattern 4 as compared with the part covering the diffusion region 3. Such a variation in the thickness of the insulation film 5 may reach as much as twice the minimum thickness of the film 5.

In such a case, the etching of the layer 5 immediately reaches the conductor pattern in the opening 6B while in the state that the etching of the layer 5 is still in progress in the opening 6A. In such a case, chemical species produced as a result of interaction between the plasma used in the reactive ion etching process and the conductor pattern 4, attack the side wall of the contact hole 5B, and the size of the contact hole 5B is substantially increased as a result as compared with a nominal size indicated in FIG. 1B by a broken line. Further, the opening 6B of the resist 6 may increase the size thereof as indicated in FIG. 1A by arrows as a result of continuous application of plasma to the photoresist 6 in correspondence to the part where the thickness of the resist 6 is reduced. It should be noted that, while the photoresist 6 has a large resistance against etching as compared with the insulation film 5, such a resistance is by no means infinite.

As a result, the conventional process and the contact structure produced as a result of such a process have suffered from the problem of uncontrolled increase in the size of the contact hole, known as CD (critical dimension) loss. Further, such a contact hole that experienced the problem of CD loss generally shows an irregular shape as indicated in FIG. 2. It should be noted that such an irregular shape occurs as a result of attack of the contact hole side wall by the species produced as a result of reaction between the plasma and the conductor such as the conductor pattern 4.

When an electric contact is formed at such an irregular contact hole, there tends to occur the problem of electromigration in which the electrons concentrated to sharp points in the contact hole induce a displacement of the metal atoms filling the contact hole, leaving behind a void. Similarly, there occurs the problem of stress migration. Thereby, the electrical contact becomes unreliable and the life-time of the contact is reduced significantly.

Further, such an unwanted and uncontrolled increase in the size of the contact hole can be detrimental to minute semiconductor devices such as submicron devices in which the conductor pattern 4 has a width smaller than one micron.

In addition, the existence of stepped structure on the surface of a layer in which a submicron contact hole is to be formed, raises the well known problem of insufficient focal depth of the optical system that is used in a high resolution photolithography. It should be noted that the high resolution optical exposure systems for use in high-resolution, submicron photolithography generally have an optical system of large numerical aperture for increased resolution, while the optical system of such a large numerical aperture can provide only a very limited focal depth. Thus, simultaneous exposure of contact holes at two different levels is extremely difficult as long as such a high resolution optical exposure system is used.

In relation to the formation of minute, submicron contact holes, various proposals are made so far.

For example, the Japanese Laid-open Patent Publication 4-125925 describes a process in which a minute contact hole is formed in a larger, but shallower depression formed in an insulation film.

FIGS. 3A-3E show the process proposed in the foregoing reference.

Referring to FIG. 3, a photoresist 12 is provided on an insulation film 11 covering the surface of a Si substrate 10 in the step of FIG. 3A, wherein the photoresist 12 is formed with an opening 12A as a result of a photolithographic patterning process. The insulation film 11 may include a CVD-deposited silicon oxide film and a PSG layer formed thereon.

Next, in a step of FIG. 3B, an RIE process is applied to the insulation film 11 while using the photoresist 12 as a mask, to form a depression 11A in the insulation film 11 in correspondence to the opening 12A, such that the depression 11A does not reach the substrate 10.

Further, a step of FIG. 3C is conducted in which the process condition of the RIE process is changed such that a deposition occurs rather than etching. As a result, an organic layer 13 of fluorocarbon is deposited on the structure of FIG. 3B as indicated in FIG. 3C.

Next, in a step of FIG. 3D, the process condition is again set such that a reactive ion etching occurs, and the insulation film 11 is etched vertically while using the resist 12 as well as a part of the layer 13 covering the inner wall of the depression 11A as a mask. As a result, a contact hole 11B of a reduced diameter is formed generally at the center of the depression 11A. Further, a part of the organic layer 13 remains as an organic cover 13A that covers the side wall of the depression 11A.

After the step of FIG. 3D, the photoresist 12 as well as the organic cover 13A are removed by an ashing process to form a structure shown in FIG. 3E in which the through hole 11B of a smaller diameter is formed generally at the center of the depression of 11A of a larger diameter.

By forming the contact hole as indicated in FIG. 3E, it is possible to fill the contact hole by a conductive material such as metal relatively easily, even when the contact hole 11B is very small. Thereby, an excellent step coverage is guaranteed.

On the other hand, the device of the foregoing reference has an obvious drawback in that the step formed at the boundary between the contact hole 11B and the depression 11A invites a sudden concentration of electron current in the conductive material filling the contact hole when the electron current flows into the contact hole 11B from the depression 11A. See FIG. 4A that shows the electron current by arrows. It should be noted that such a sudden increase of the current density is particularly harmful to the contact due to the electromigration effect.

The contact structure of FIG. 3E has another serious drawback in that the contact structure has a larger diameter at the top part thereof in correspondence to the depression 11A for contact with an upper interconnection pattern. In such a structure where the top part of the contact structure has an increased diameter, it should be noted that a small alignment error in the contact structure as indicated in FIG. 4B by an arrow may cause an unwanted contact of the conductor material filling the contact structure with an adjacent conductor pattern 14 provided on the insulation film 11.

The Japanese Laid-open Patent Publication 4-206819 describes a formation of a contact structure in which a silicon oxide film is initially etched in a dry etching apparatus with a condition of generally isotropic etching in which etching occurs both in the direction perpendicular to the major surface of the silicon oxide film and in the direction parallel to the major surface of the silicon oxide film, followed by an anisotropic etching process proceeding perpendicularly to the major surface of the silicon oxide film. The same resist mask is used for the isotropic etching phase and the anisotropic etching phase.

The resultant contact structure is somewhat similar to the contact structure of FIGS. 4A and 4B except that the depression 11A is defined by a gently curved surface characteristic to the isotropic etching process. Thus, while the contact structure of the foregoing reference may be free from the problem of sudden increase of the current density explained with reference to FIG. 4A, the contact structure still has the problem of alignment error explained with reference to FIG. 4B.

Further, associated with the use of the resist mask both in the isotropic etching phase and in the anisotropic etching phase, the contact structure suffers from the problem of CD loss caused by the etching of the resist mask, which is by no means ignorable when forming a submicron contact hole.

Further, the Japanese Laid-open Patent Publication 4-206819 describes a method for patterning an Al layer by alternately and repeatedly conducting an RIE process and an oxidation process such that the side wall of the patterned groove is protected by an aluminum oxide film. Such a process, while capable of controlling the cross section of the groove with high precision, has a drawback in that the aluminum oxide layer covering the side wall of the groove act as an etching mask when applying an RIE process to the bottom part of the groove. Thereby, the width of the groove formed at the bottom part of the existing groove becomes inevitably smaller by the amount corresponding to the thickness of the aluminum oxide film covering the side wall of the grooves. Thereby, the groove formed by repeating the RIE and oxidation inevitably has a cross section defined by inclined side walls.

When such a process is applied to a contact hole, the contact hole is inevitably defined by an inclined side wall covered by an oxide, and the contact hole has an increased diameter at the top part thereof as compared with the bottom part. Again, it will be noted that such a tapered contact hole structure is disadvantageous for submicron devices in view of the problems associated with the alignment error explained with reference to FIG. 4B.

Further, the Japanese Laid-open Patent Publication 63-260051 describes a process for forming a contact structure in an insulation film, including the steps of forming a contact hole in the insulation film, covering the side wall of the contact hole by a metal, and filling the contact hole thus covered by the metal by another metal to form a conductive plug. Thereby, formation of void between the conductive plug and the side wall of the contact hole is successfully eliminated, and a reliable electrical contact is guaranteed.

However, the process of the foregoing reference has a drawback that it cannot eliminate the problem of CD loss, as the contact hole itself is formed by using an ordinary resist pattern.

Summarizing above, none of the conventional processes for forming contact holes and the contact structures formed by such processes can provide a solution to the problem of CD loss explained with reference to FIGS. 1A and 1B.

particularly in the presence of stepped structure as in the case of recent integrated circuits that generally have a multi-layer interconnection structure.

SUMMARY OF THE INVENTION

Accordingly, it is a general object of the present invention to provide a novel and useful semiconductor device having a contact structure and a fabrication process thereof wherein the foregoing problems are eliminated.

Another and more specific object of the present invention is to provide semiconductor device having a contact structure and a fabrication process thereof wherein the problem of CD loss is successfully eliminated.

Another object of the present invention is to provide a contact structure, comprising:

a conductive first layer;

a second layer of an insulating material provided on said first layer;

a third layer provided on said second layer;

a depression provided on said second and third layers so as to extend from a top surface of said third layer toward a bottom surface of said second layer, said depression having a bottom surface above said bottom surface of said second layer and below a bottom surface of said third layer, said depression being defined by a first inner peripheral wall having a first inner diameter and extending from said top surface of said third layer to said bottom surface of said depression;

a through hole provided on said bottom surface of said depression generally at a center thereof, such that said through hole extends from said bottom surface of said depression to said bottom surface of said second layer, said through hole thereby exposing a top surface of said first layer and being defined by a second inner periphery having a second inner diameter substantially smaller than said first inner diameter; and a ring-shaped wall member fitted in said depression so as to form an intimate contact with said first inner peripheral wall of said depression, said ring-shaped wall member being thereby defined by a third inner peripheral wall having a third inner diameter substantially identical to said second inner diameter of said through hole.

said third layer being formed of an inorganic insulating material that shows a selectivity to a dry etching process with respect to said material forming said second layer, said ring-shaped wall member being formed of an inorganic material that shows a selectivity to a dry etching process with respect to said material forming said second layer.

Another object of the present invention is to provide a semiconductor device, comprising:

a semiconductor substrate;

a conductive first layer provided on said semiconductor substrate;

a second layer of an insulating material provided on said first layer;

a third layer provided on said second layer;

a depression provided on said second and third layers so as to extend from a top surface of said third layer toward a bottom surface of said second layer, said depression having a bottom surface above said bottom surface of said second layer and below a bottom surface of said third layer, said depression being defined by a first inner peripheral wall having a first inner diameter and extending from said top surface of said third layer to said bottom surface of said depression;

a through hole provided on said bottom surface of said depression generally at a center thereof, such that said through hole extends from said bottom surface of said depression to said bottom surface of said second layer, said through hole thereby exposing a top surface of said first layer and being defined by a second inner periphery having a second inner diameter substantially smaller than said first inner diameter; and a ring-shaped wall member fitted in said depression so as to form an intimate contact with said first inner peripheral wall of said depression, said ring-shaped wall member being thereby defined by a third inner peripheral wall having a third inner diameter substantially identical to said second inner diameter of said through hole.

said third layer being formed of an inorganic insulating material that shows a selectivity to a dry etching process with respect to said material forming said second layer, said ring-shaped wall member being formed of an inorganic material that shows a selectivity to a dry etching process with respect to said material forming said second layer.

Another object of the present invention is to provide a semiconductor device, comprising:

a semiconductor substrate having a surface structure, said surface structure including a first region having a first level and a second region having a second, elevated level;

a first conductive layer provided on said first region of said semiconductor substrate;

a second conductive layer provided on said second region of said semiconductor substrate;

a first insulating layer provided on said surface structure of said semiconductor substrate so as to bury said first and second conductive layers underneath;

a second insulating layer provided on said second layer so as to cover said first and second regions;

a first depression provided on said first and second insulating layers in correspondence to said first region so as to extend from a top surface of said second insulating layer toward a bottom surface of said first insulating layer, said depression having a bottom surface above said bottom surface of said first insulating layer and below a bottom surface of said second insulating layer in said first region, said first depression being defined by a first inner peripheral wall having a first inner diameter and extending from said top surface of said second insulating layer to said bottom surface of said first depression;

a first through hole provided on said bottom surface of said first depression generally at a center thereof, such that said first through hole extends from said bottom surface of said first depression to said bottom surface of said first insulating layer, said first through hole thereby exposing a top surface of said first conductive layer and being defined by a second inner periphery having a second inner diameter substantially smaller than said first inner diameter;

a first ring-shaped wall member fitted in said first depression so as to form an intimate contact with said first inner peripheral wall of said first depression, said first ring-shaped wall member being thereby defined by a third inner peripheral wall having a third inner diameter substantially identical to said second inner diameter of said first through hole.

a second depression provided on said first and second insulating layers in correspondence to said second region so as to extend from a top surface of said second insulating layer toward a bottom surface of said first insulating layer, said depression having a bottom surface above said bottom surface of said first insulating layer and below a bottom surface of said second insulating layer in said second region, said second depression being defined by a fourth inner peripheral wall having a fourth inner diameter and extending from said top surface of said second insulating layer to said bottom surface of said second depression;

a second through hole provided on said bottom surface of said second depression generally at a center thereof, such that said second through hole extends from said bottom surface of said second depression to said bottom surface of said first insulating layer, said second through hole thereby exposing a top surface of said second conductive layer and being defined by a fifth inner periphery having a fifth inner diameter substantially smaller than said fourth inner diameter;

a second ring-shaped wall member fitted in said second depression so as to form an intimate contact with said fifth inner peripheral wall of said second depression, said second ring-shaped wall member being thereby defined by a sixth inner peripheral wall having a sixth inner diameter substantially identical to said fifth inner diameter of said second through hole;

a first electrode filling said first ring-shaped wall member and said first through hole in an intimate contact with said first conductive layer; and a second electrode filling said second ring-shaped wall member and said second through hole in an intimate contact with said second conductive layer;

said second insulating layer being formed of an inorganic insulating material that shows a selectivity to a dry etching process with respect to said material forming said first insulating layer, said first and second ring-shaped wall members being formed of an inorganic material that shows a selectivity to a dry etching process with respect to said material forming said first insulating layer, both of said second inner diameter of said first through hole and said fourth inner diameter of said second through hole being of a submicron size and agreeing within a deviation of less than 0.1 μm, said first ring-shaped wall member having a resistance substantially exceeding a resistance of said first electrode, said second ring-shaped wall member having a resistance substantially exceeding a resistance of said second electrode.

Another object of the present invention is to provide a semiconductor integrated circuit, comprising:

a semiconductor substrate;

a plurality of semiconductor devices provided commonly on said semiconductor substrate, each of said semiconductor devices comprising:

a conductive first layer provided on said semiconductor substrate;

a second layer of an insulating material provided on said first layer;

a third layer provided on said second layer;

a depression provided on said second and third layers so as to extend from a top surface of said third layer toward a bottom surface of said second layer, said depression having a bottom surface above said bottom surface of said second layer and below a bottom surface of said third layer, said depression being defined by a first inner peripheral wall having a first inner diameter and extending from said top surface of said third layer to said bottom surface of said depression;

a through hole provided on said bottom surface of said depression generally at a center thereof, such that said through hole extends from said bottom surface of said depression to said bottom surface of said second layer, said through hole thereby exposing a top surface of said first layer and being defined by a second inner periphery having a second inner diameter substantially smaller than said first inner diameter; and a ring-shaped wall member fitted in said depression so as to form an intimate contact with said first inner peripheral wall of said depression, said ring-shaped wall member being thereby defined by a third inner peripheral wall having a third inner diameter substantially identical to said second inner diameter of said through hole.

said third layer being formed of an inorganic insulating material that shows a selectivity to a dry etching process with respect to said material forming said second layer, said ring-shaped wall member being formed of an inorganic material that shows a selectivity to a dry etching process with respect to said material forming said second layer.

Another object of the present invention is to provide a method for fabricating a semiconductor device, comprising the steps of:

forming a second layer of an insulating material on a conductive first layer;

forming a third layer on said second layer by depositing an inorganic material that shows a selectivity to a dry etching process with respect to said material forming said second layer;

forming a depression in said second and third layers by a dry etching process while using a resist mask provided on said third layer, such that said depression extends from a top surface of said third layer toward a bottom surface of said second layer, said dry etching process being conducted by setting a condition such that a dry etching occurs with substantially the same etching rate in said second and third layers, said depression being thereby formed so as to have a bottom surface below a bottom surface of said third layer and above said bottom surface of said second layer and a first inner peripheral wall having a first inner diameter;

depositing a fourth layer of an inorganic material that shows a selectivity to a dry etching process with respect to said material forming said second layer, on said third layer with a uniform thickness and in conformity with a shape of said depression;

removing said fourth layer from said top surface of said third layer by applying a dry etching process such that said dry etching process acts substantially vertically to said fourth layer, said step of removing said fourth layer being conducted such that a part of said fourth layer remains in the form of a ring-shaped member fitted in said depression with an intimate contact with said first inner peripheral wall of said depression, said ring-shaped member having a second inner peripheral wall of a second, smaller inner diameter and exposing said second layer at a bottom part thereof; and applying a dry etching process to said second layer exposed at the bottom part of said ring-shaped member, while using said ring-shaped member and said third layer as a mask, such that a contact hole having an inner diameter substantially identical to said second inner diameter of said ring-shaped member is formed in said second layer, such that said contact hole reaches said bottom surface of said second layer and such that said contact hole has a third inner peripheral wall substantially in alignment to said second inner peripheral wall of said ring-shaped member.

According to the present invention, it is possible to form a contact hole having a smooth, well defined inner peripheral wall by forming the contact hole while using the ring-shaped member of inorganic material as an etching mask. Thereby, the problem of electromigration in the contact hole caused by the concentration of electron current is successfully eliminated.

Further, as a result of use of such an inorganic etching mask, the problem of CD loss caused by the etching of the resist is eliminated, even when the contact hole is provided on a stepped part where the thickness of the second layer, and hence the thickness of the photoresist provided thereon, is small.

Further, the present invention enables to form the contact hole with a size smaller than the resolution limit of the optical exposure system used for exposing the device pattern. It should be noted that the inner diameter of the contact hole corresponds to the inner diameter of the ring-shaped member, while the inner diameter of the ring-shaped member is substantially smaller than the inner diameter of the depression that is formed by a photolithographic patterning process.

This, in turn, means that one can use a low resolution optical system for the exposure of the depression, even in the case the semiconductor device to be fabricated is a submicron device having submicron patterns. As a low resolution optical system has a larger focal depth as compared with a high resolution optical system, one can achieve the desired exposure of the large-diameter depressions without problem of focal depth even in such cases in which the depressions and hence the submicron contact holes therein are to be formed on a stepped part of the device. Thus, the present invention provides a powerful solution to the problem of formation of submicron contact holes particularly in semiconductor integrated circuits having a multi-layer interconnection structure.

Other objects and further features of the present invention will become apparent from the following detailed description of the preferred embodiments when read in conjunction with the attached drawings.

DETAILED DESCRIPTION OF THE PREFERRED EMBODIMENT

FIGS. 5A–5E show a process for forming a contact hole according to a first embodiment of the present invention.

Figure 5A:
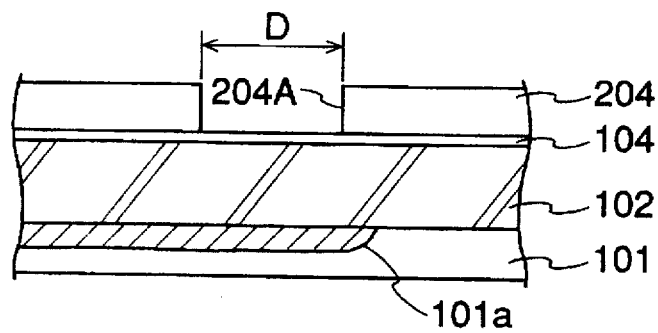
FIGS. 5A–5E are diagrams showing the process of forming a contact hole according to a first embodiment of the present invention.

Referring to FIG. 5A, an insulation layer 102, typically formed of a stacking of a CVD-deposited silicon oxide layer (not shown) and a planarization layer (not shown) of a PSG or BPSG covering the silicon oxide layer, is provided on a silicon substrate 101 with a thickness of 0.5–1.8 μm. The silicon substrate 101 may include a diffusion region 101a doped with an impurity element to the p-type or n-type.

On the insulation layer 102, a silicon nitride layer 104 is deposited typically with a thickness of 10–200 nm, preferably in the range of 20–100 nm. Further, a photoresist 204 is provided on the silicon nitride layer 104, and an opening 204A is formed in the photoresist 204 by a photolithographic exposure process with a diameter D. The silicon nitride layer 104 may be formed by a CVD process or a reactive sputtering process, while the insulation layer 102 may be formed by depositing a silicon oxide layer and a PSG or BPSG layer successively by a CVD process. In the CVD process, the silicon oxide layer may be deposited by using $O_3$ and TEOS, while the BPSG layer may be deposited by using $SiH_4$ or TEOS, $O_2$ or $O_3$, $PH_3$ and $B_2H_6$ as the source materials. When forming the silicon nitride layer 104 by a CVD process, $SiH_4$ and $NH_3$ may be used as the source materials.

Figure 5B:
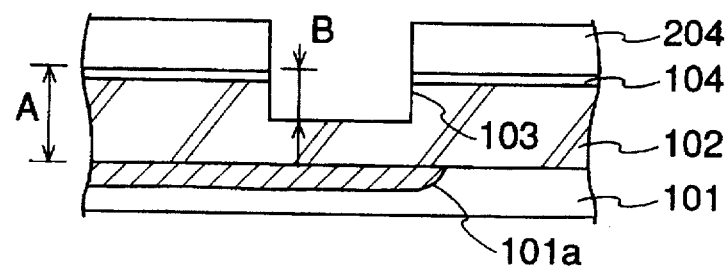

Next, in the step of FIG. 5B, the structure of FIG. 5A is incorporated into a reaction chamber of a dry etching apparatus that includes a plasma generator of the ECR type, the ICP (induced coupled plasma) type or the parallel-plate type, and the layers 104 and 102 are removed in correspondence to the opening 204A by causing an anisotropic etching process acting substantially perpendicular to the layered structure on the substrate 101. Thereby, the etching condition is set such that the layer 104 of silicon nitride is etched with a rate substantially the same rate of etching of the layer 102. Thus, after the formation of a through hole in the layer 104 in correspondence to the opening 204, the etching proceeds into the layer 102, while the etching of the layer 102 is interrupted before the etching reaches the bottom surface of the layer 102. Thereby the structure shown in FIG.

5B is obtained in which a depression 103 having an inner diameter substantially identical to the diameter D is formed in the layer 102.

Figure 5C:
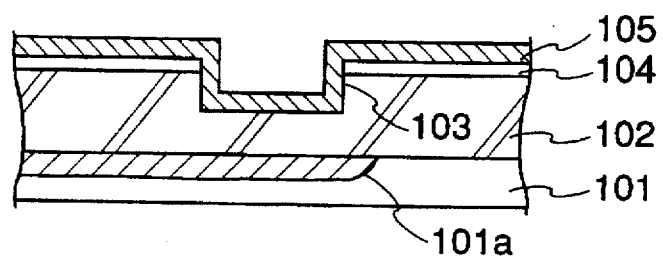

Next, in the step of FIG. 5C, the resist 204 is removed, and an undoped polysilicon layer 105 is deposited on the surface of the silicon nitride layer 104 by a CVD process with a generally uniform thickness. Thereby, the polysilicon layer 105 covers the depression 103 in conformity with the shape of the depression 103.

Figure 5D:
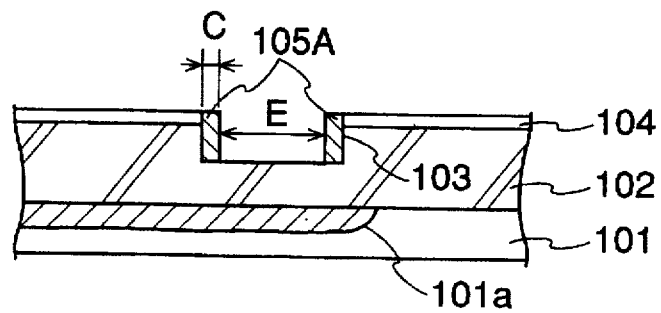

Further, in the step of FIG. 5D, an anisotropic etching process is applied to the polysilicon layer 105 such that the etching proceeds generally perpendicularly to the layer 105, until the silicon nitride layer 104 on the surface of the layer 102 is exposed. Thereby, the etching condition is set such that the polysilicon layer 105 is etched with an etching rate much larger than the etching rate of the silicon nitride layer 104 or the insulating layer 102. Thereby, the etching stops in the state of FIG. 5D in which the surface of the layer 104 is exposed and the bottom of the depression 103 is exposed. As a result of such an anisotropic process, a polysilicon ring 105A is formed as a residue of the polysilicon layer 105 such that the polysilicon ring 105A is fitted into the depression 103 with an intimate contact with the inner peripheral wall of the depression 103. Thereby, the polysilicon ring 105A has an inner diameter E smaller than the inner diameter D of the depression 103 by twice the thickness C of the ring 105A.

After the step of FIG. 5D, the etching condition is changed such that the insulator layer 102 of silicon oxide, covered by a layer of PSG or BPSG, is preferentially etched over any of the silicon nitride layer 104 or the polysilicon ring 105A. Thereby, the silicon nitride layer 104 and the polysilicon ring 105A act as an etching mask, and a contact hole 102A is formed with an inner diameter substantially identical to the inner diameter E of the ring 105A. The contact hole 102A extends to the bottom of the layer 102 and exposes the diffusion region 101a formed on the substrate 101.

In the process of FIGS. 5A–5E, the dry etching process is conducted by a using commonly used etching gas such as $Cl_2$, $CCl_3$, $SF_6$, HBr, wherein the foregoing setting of selectivity of the etching rate is achieved by appropriately controlling the internal pressure of the dry etching apparatus and the electric power of the plasma used for exciting the etching gas in the etching apparatus.

As noted before, the polysilicon ring 105A has an inner diameter E smaller than the inner diameter D of the depression 103 by twice the thickness C of the ring 105A. Thereby, there holds a relationship of C=(D−E)/2. Thus, the thickness of the ring 105A and hence the thickness of the polysilicon layer 105 is chosen, based upon the desired size E of the contact hole 102A and the size D of the depression 103, according to the foregoing relationship.

Figure 5E:
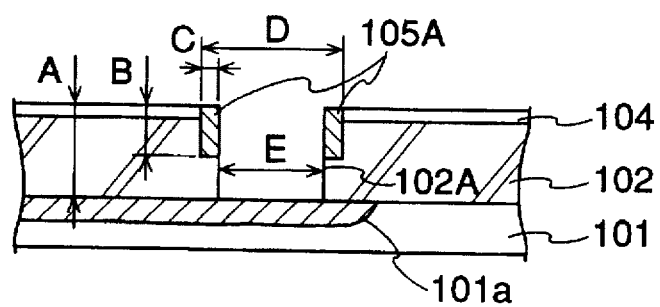
Figure 6:
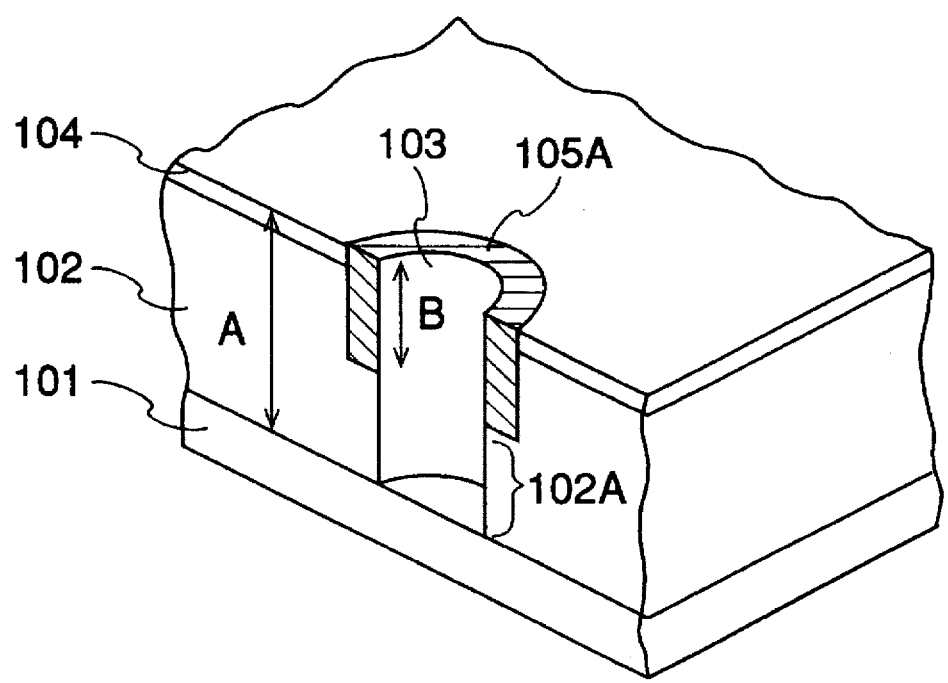
FIG. 6 is a diagram showing the contact hole of the first embodiment in a perspective view.

FIG. 6 shows the construction of the contact structure obtained according to the process of FIGS. 5A–5E in a perspective view.

Figure 2:
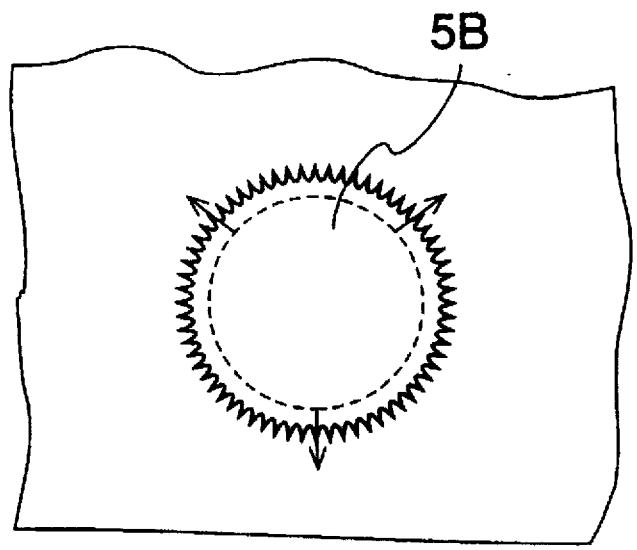
FIG. 2 is a diagram showing a contact hole that has experienced the CD loss during the formation process thereof.
Figure 3A:
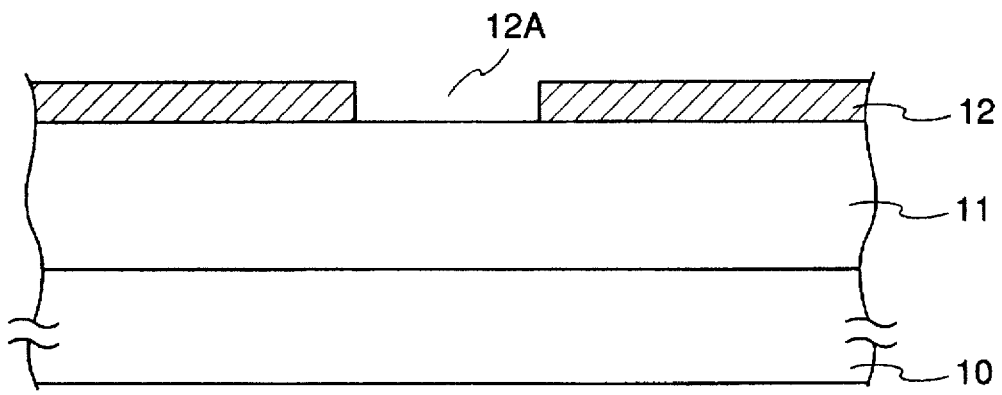
FIGS. 3A–3E are diagrams showing a conventionally proposed process for forming a contact hole.
Figure 3B:
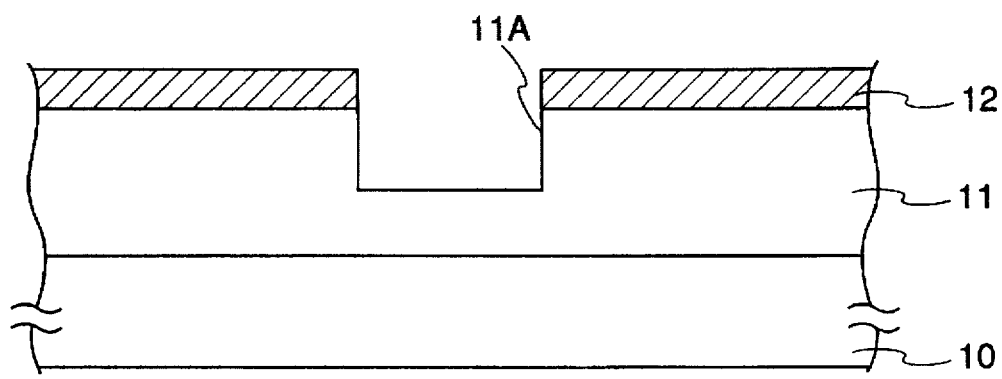
Figure 3C:
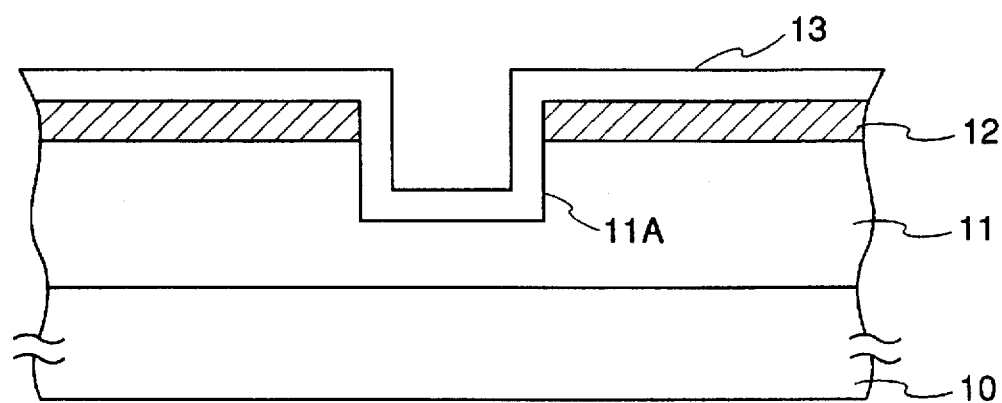
Figure 3D:
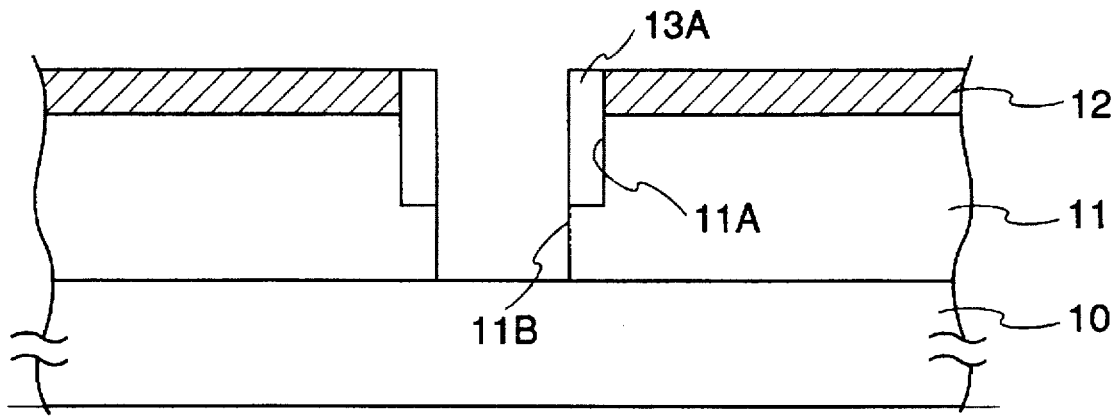
Figure 3E:
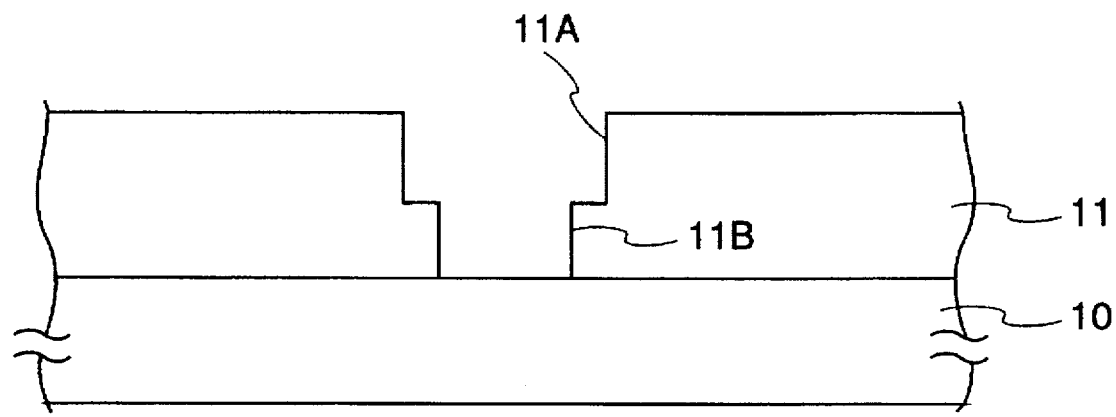

Referring to FIG. 6, the inner wall of the ring 105A is self-aligned with the inner wall of the contact hole 102A, as the contact hole 102A is formed by using the ring 105A as a mask. Thereby, the problem of CD loss does not occur, as no resist pattern is used in the formation of the contact hole 102A. Associated with this, the contact hole 102A has a smooth inner surface and the problem of electromigration, caused conventionally by the irregularities on the inner wall of the contact hole as in the case of FIG. 2, is successfully eliminated.

In the contact structure of FIG. 6, it should be noted that the height of the ring 105A corresponds to the depth B of the depression 103, wherein the depth B is set such that the depth B does not exceed 50% of the total thickness A of the layers 102 and 104. In other words, the thickness A and the depth B are determined so as to satisfy the relationship of $(B/A) \times 100 \leq 50\%$. By doing so, the problem of etching of the resist 204 by continuing the process of FIG. 5B is successfully avoided. In other words, it is possible to form the depression 103 without causing the problem of CD loss. Further, by limiting the depth of the depression 103 as such, the polysilicon layer 105 deposited in the step of FIG. 5C covers the side wall of the shallow contact hole 103 in conformity with the shape of the contact hole 103. When the depth of the depression 103 is larger, there appears a problem in the coverage of the side wall of the depression 103 by the polysilicon layer 105.

In an experiment for evaluating the effect of the contact structure of FIG. 6, a contact structure was formed by setting the thickness of the insulation layer 102 to 900 nm and the thickness of the silicon nitride layer 104 to 50 nm.

In this experiment, the depression 103 was formed in the step of FIG. 5B with the depth B of 400 nm and with the diameter D set to 0.5 μm, and a TiN film was deposited in the step of FIG. 5C as the layer 105 in place of polysilicon, with a thickness set such that the thickness C at the side wall of the depression 103 becomes 75 nm. The deposition of the TiN layer 105 was made by a reactive sputtering process conducted at a substrate temperature of 450° C. under a $N_2$ atmosphere set to a pressure of 2 mTorr, while using a Ti target. In the anisotropic etching step of FIG. 5D, an ECR plasma etching was used while using a mixture of $BCl_3$ and $Cl_2$ under the pressure of 10 mTorr and a substrate temperature of 40° C., while applying an RF power of 60 W for maintaining the plasma. After the structure of FIG. 5D is obtained as such, an etching process for the step of FIG. 5E is conducted by changing the etching gas to a mixture of $C_4F_8$ and $O_2$. The etching condition was set such that the plasma etching acts selectively upon the insulator layer 102.

It was confirmed that the inner diameter of the contact hole 102A thus obtained was 0.36 μm that is only 0.01 μm larger than the nominal size of the contact hole of 0.35 mm, which corresponds to the design rule. Further, it was confirmed that the contact hole formed as such has a smooth, well defined inner peripheral surface, which is definitely advantageous for suppressing electromigration or stress migration.

Figure 1A:
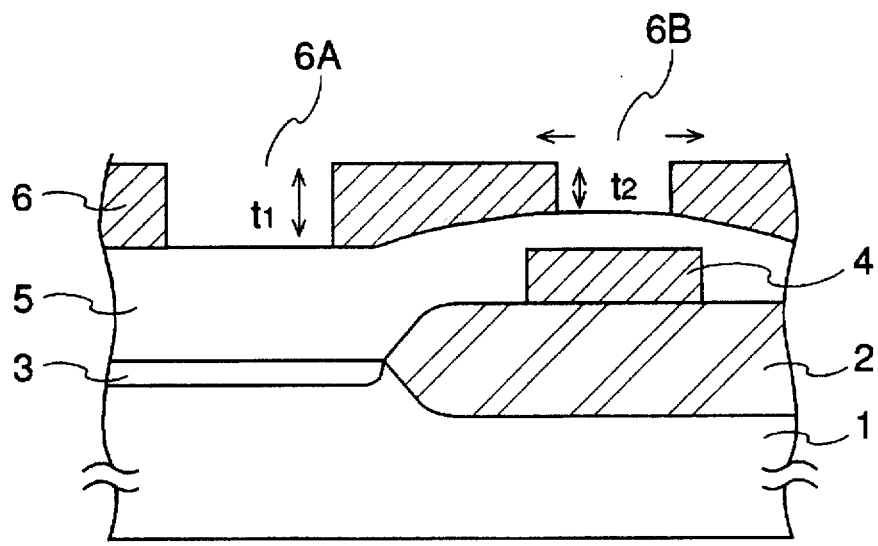
FIGS. 1A and 1B are diagrams showing the problem of CD loss occurring in conventional contact structures.
Figure 1B:
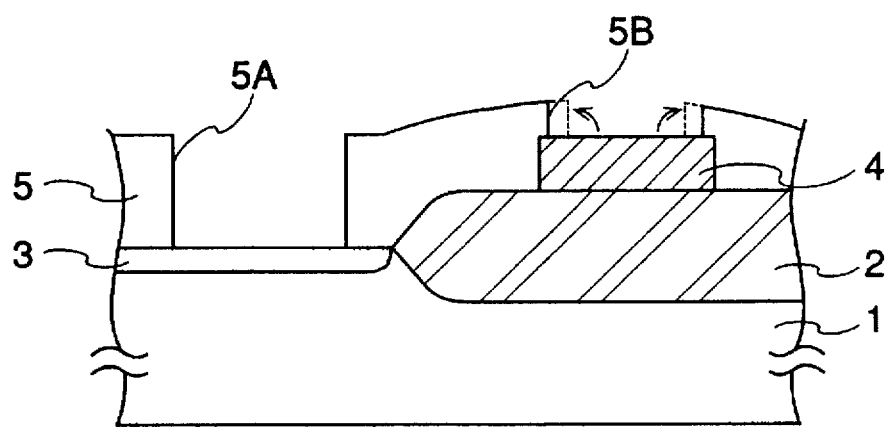

In a comparative test, an experiment was made according to the process of FIGS. 1A and 1B, wherein an opening of 0.3 μm in diameter was formed in the photoresist 6 covering the insulator layer 5 of the same composition and thickness as in the case of the insulator layer 102 in the foregoing experiment, except that there is no silicon nitride layer covering the surface of the insulator layer 5. By conducting an anisotropic etching of the insulator layer 102 in the same plasma etching apparatus while using the resist 6 as a mask, a contact hole corresponding to the contact hole 5A was obtained with a diameter of 0.45 μm, which is 0.1 μm larger than the diameter of 0.35 μm determined by the design rule. In other words, a CD loss of as much as 0.1 μm was observed in this case. Further, the contact hole thus obtained clearly showed an irregular edge similar to the one shown in FIG. 2, indicating that such a contact structure is vulnerable to electromigration or stress migration.

Figure 7:
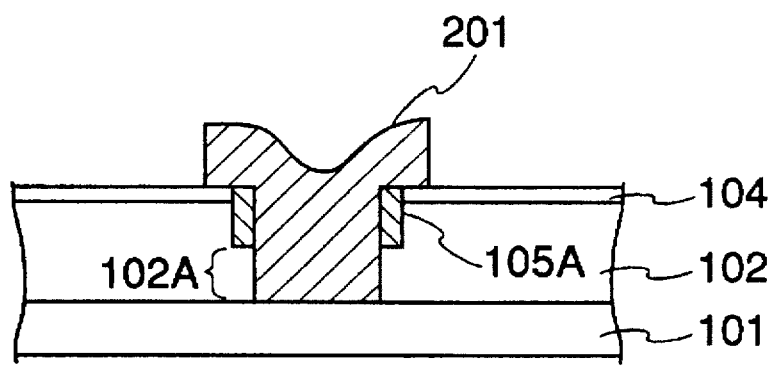
FIG. 7 is a diagram showing the contact hole of the first embodiment in a state that an electrode fills the contact hole.

FIG. 7 shows the contact structure of FIG. 6 in the state that an aluminum electrode 201 fills the contact hole.

Figure 4A:
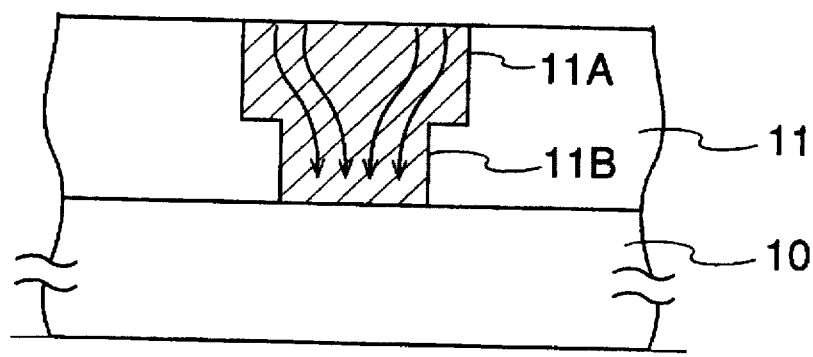
FIGS. 4A and 4B are diagrams showing the problems pertinent to the conventional contact hole of FIGS. 3A–3E.
Figure 4B:
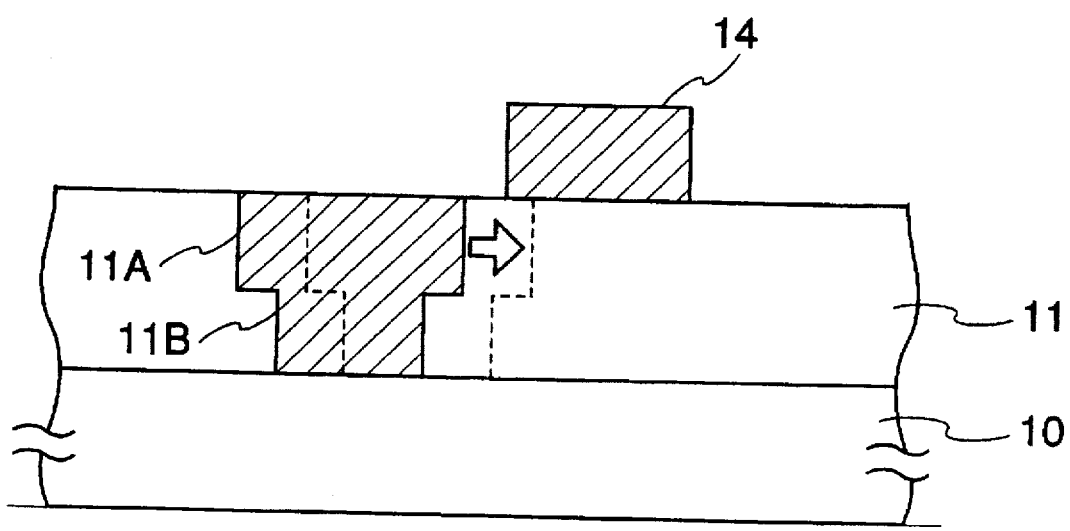

In such a contact structure, it is preferable to form the ring 105A to have a high resistance higher than the aluminum electrode 201 or the conductor pattern 101 underneath the insulator layer 102, in view of eliminating the problem of concentration of electron current explained with reference to FIG. 4A or the problem of alignment error explained with reference to FIG. 4B. For this reason, an undoped polysilicon is used for the ring 105A. On the other hand when the electrode 201 is formed of a polysilicon doped to any of the p- or n-type, the polysilicon ring 105A may be doped to the opposite conductivity type such that a depletion region is formed at the interface between the electrode 201 and the ring 105A. Alternatively, the polysilicon ring 105A may be doped by a deep impurity such as Au or Cr.

Further, depending upon the situation, one may use a transitional metal such as Ti, Mo, Ta, W or a metal compound such as TiN or silicide for the ring 105A as described in the present embodiment.

Further, one may use any insulating material for the ring 105A, as long as the insulating material shows a selectivity of etching with respect to the material forming the insulator layer 102.

Figure 8A:
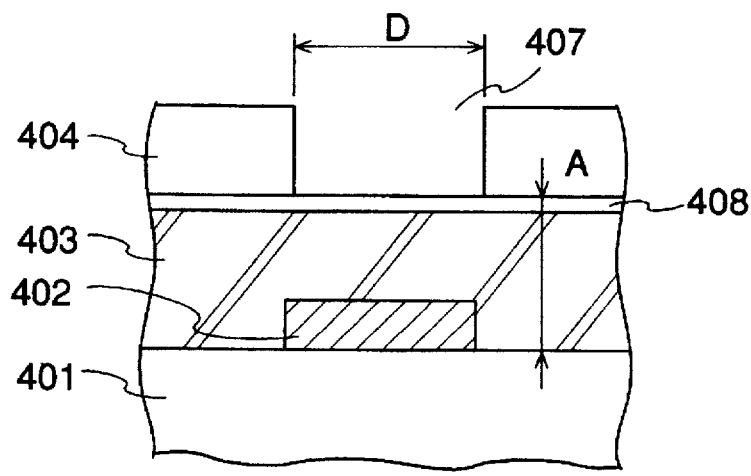
FIGS. 8A–8C are diagrams showing the construction of a contact structure according to a second embodiment of the present invention.
Figure 8B:
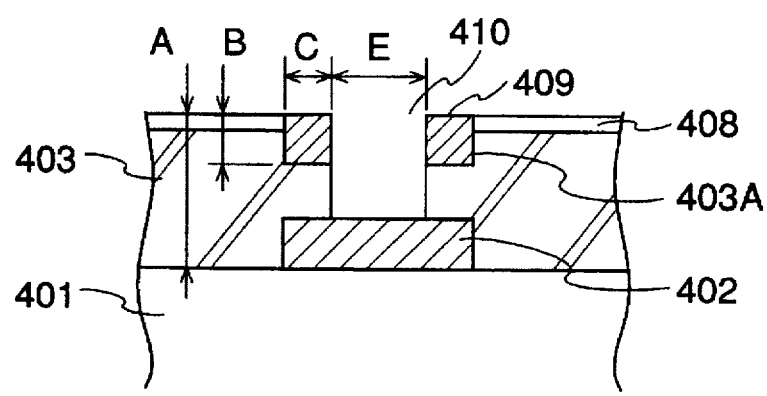
Figure 8C:
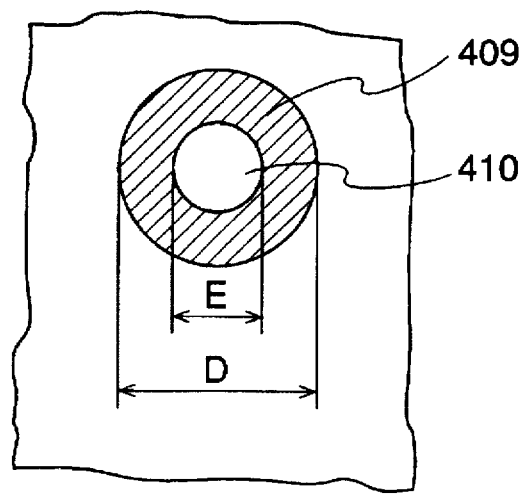

FIGS. 8A–8C show a second embodiment of the present invention in which the contact structure is formed on a conductor pattern provided on a lower layer.

Referring to FIG. 8A, a conductor layer of an Al-alloy containing therein Si and Cu, is deposited on a silicon oxide layer 401, which silicon oxide layer 401 in turn being formed on a Si substrate (not shown) by a pyrogenic process, wherein the Al-alloy layer thus formed is patterned subsequently to form an Al-alloy pattern 402. The foregoing Al-alloy layer actually carries a TiN layer thereon, and is formed by a sputtering process conducted in an Ar atmosphere at a substrate temperature of 400° C. and a pressure of 2 mTorr while using a target of an Al-alloy containing Si with 1 wt % and Cu with 0.5 wt %. Thereby, the foregoing Al-alloy layer is deposited with a thickness of 600 nm. After the Al-alloy layer is thus formed, a reactive sputtering process of Ti is conducted in a $N_2$ atmosphere while holding the substrate temperature at 400° C. and the pressure at 2.0 mTorr, without exposing the Al-alloy layer to the air. Thereby, a Ti target is used, and the TiN layer is formed with a thickness of 20 nm.

After the Al-alloy layer is thus formed, the same is patterned as noted already, wherein a resist pattern having a pattern width of 0.5 μm is formed on the Al-alloy layer, and a dry etching process is applied to the Al-alloy layer while using the resist pattern as an etching mask, to form the conductor pattern 402.

After the conductor pattern 402 is thus formed on the layer 401, a silicon oxide layer 403 is provided further on the layer 401 so as to bury the conductor pattern 402 underneath by conducting a CVD process, in which $O_3$ and TEOS are used as the source of $SiO_2$, and the silicon oxide layer 403 is deposited with a thickness of 900 nm. Further, a SiN layer 408 is formed on the silicon oxide layer 403 by a plasma CVD process, in which the SiN layer 408 is grown with a thickness of 50 nm by using $SiH_4$ and $NH_3$ as source gases. Thereby, the layers 403 and 408 form together a total thickness A of 950 nm.

On the SiN layer 408, a photoresist 404 is applied by a spin coating process, followed by an exposure process in which an opening 407 is formed in the resist 404 in correspondence to the pattern 402 with a diameter D of 0.6 μm. Thereby, the structure of FIG. 8A is obtained.

Next, in the step of FIG. 8B, the structure of FIG. 8A is incorporated into a dry etching apparatus equipped with a parallel plate type plasma generator, and the SiN layer 408 and the silicon oxide layer 403 are subjected to an anisotropic etching process acting substantially vertically to the substrate while setting the condition such that the etching rate for the SiN layer 408 and the etching rate for the silicon oxide layer 403 are substantially the same. In the present embodiment, a mixture of $C_2F_6$ and $CHF_3$ is introduced into the reaction chamber as an etching gas. As a result of the etching, a depression 403A is formed in the layers 408 and 403 in correspondence to the opening 407, with a depth B of 300 nm, which is smaller than one-half the thickness of the layer 403.

After the formation of the depression 403A as such, the photoresist 404 is removed, and a polysilicon layer (not shown) is deposited on the layer 408 so as to cover the foregoing depression 403A, with a thickness of about 100 nm at the side wall of the depression 403A. Typically, such a deposition of the polysilicon layer is conducted by a CVD process at a substrate temperature of 530° C. and a pressure of 100 mTorr while using $Si_2H_6$ as a source of polysilicon. The polysilicon layer thus formed is substantially free from doping and has a large resistance.

The structure thus covered by the polysilicon layer is subsequently subjected to another dry etching process conducted in the same dry etching apparatus equipped with the ECR plasma generator, wherein an anisotropic etching process acting substantially vertically to the principal surface of the substrate 401 is conducted at a substrate temperature of 10° C. under a pressure of 10 mTorr, while using a mixture of HBr and $O_2$ as an etching gas. During the foregoing dry etching process, an RF power of 60 W was applied. Thereby, the anisotropic etching process acts selectively upon the polysilicon layer, and the etching stops spontaneously when the surface of the SiN layer 408 or the bottom of the depression 403A is exposed.

As a result of the foregoing anisotropic dry etching process, the polysilicon layer is etched back from the surface of the layer 408, leaving behind a polysilicon ring 409 filling the depression 403A in an intimate contact with the inner peripheral wall of the depression 403A. In the foregoing process, it should be noted that the thickness of the foregoing polysilicon layer is adjusted such that the polysilicon ring 409 thus formed has a central hole with a diameter E of 0.40 μm corresponding to the design rule.

After the formation of the polysilicon ring 409 as such, still another anisotropic dry etching process is conducted in the same etching apparatus while using a mixture of $C_2F_6$ and $CHF_3$ as the etching gas, with a condition set such that the etching acts selectively upon the silicon oxide layer 403. The polysilicon ring 403A is used thereby as an etching mask, and the etching proceeds vertically to the substrate 401, until the surface of the conductor pattern 402 is exposed. As a result of the etching, a vertical contact hole 410 is formed as indicated in FIG. 8B. The endpoint of the etching is easily detected by monitoring the chemical species produced as a result of the etching of the conductor pattern 402, by using a mass spectrometer.

FIG. 8C shows the contact hole 410 thus formed in a plan view.

Referring to FIG. 8C, it will be noted that the contact hole 410 has an inner diameter E, which is smaller than the inner diameter D of the depression 403A by twice the thickness C of the ring 409. In other words, there again holds the relationship C=(D−E)/2.

The result of a SEM observation indicated that the contact hole 410 thus formed has the inner diameter E of 0.42 μm, which is an excellent agreement with the nominal contact hole size determined by the design rule of 0.40 μm. Further, it was confirmed, as a result of the SEM observation, that the contact hole 410 has a smooth, circular inner wall free from irregularity, contrary to the contact hole explained with reference to FIG. 2.

As the polysilicon ring 409 of the contact hole structure of FIG. 8C has a high resistivity, no substantial current confinement occurs even when the contact hole 410 is filled by a low resistance metal such as Al. Further, even when the polysilicon ring 409 contacts with a pattern adjacent to the pattern to which an electric contact is to be made, due to the error at the time of exposure as in the case of FIG. 4B, no substantial problem of leak current occurs due to the high resistance of the polysilicon ring 409.

In the event the conductor patterns to be contacted via the contact hole 410 is formed of a polysilicon doped to the $p^+$-type or $n^+$-type, it is also possible to use a doped polysilicon for the ring 409 such that the polysilicon forming the ring 409 is doped to the opposite conductivity type. In this case, a depletion layer formed at the p-n junction expels the carriers to invade into the ring 409. Further, it is possible to increase the resistance of the polysilicon ring by incorporating therein deep impurity elements such as Au or Cr.

In comparison to the contact hole of the second embodiment, a comparative experiment was conducted in which a minute contact hole is formed directly from the state of FIG. 8A, except that the diameter D of the opening 407 is set to 0.40 μm in correspondence to the design rule and that the SiN layer 408 is not used. In this experiment, however, it was observed that the diameter of the actually formed contact hole increases to 0.55 μm, indicating that a CD loss of 0.15 μm has occurred. Further, associated with such an increase in the contact hole size, the contact hole thus obtained showed an irregular edge surface similar to the one shown in FIG. 2, indicating that attack has occurred to the side wall of the contact hole at the time of the dry etching process. As noted already, such a contact hole is vulnerable to electromigration or stress migration and can provide only a limited lifetime for the electric contact.

In any of the foregoing first and second embodiments, it should be noted that one can use a relatively low resolution optical exposure system for exposing the opening 204A in the photoresist 204 or the opening 407 in the photoresist 404 as compared with the case of the comparative experiments in which a high resolution optical exposure system has to be employed. As a high resolution optical exposure system has a very limited focal depth, proper focusing of the exposure pattern becomes extremely difficult in the case of the comparative experiments. In contrast, the present embodiment forms a contact hole with a reduced size below the resolution limit of the exposure system.

Next, a third embodiment of the present invention will be described with reference to FIGS. 9A–9F for the case of providing contact holes in a semiconductor integrated circuit at different levels.

Figure 9A:
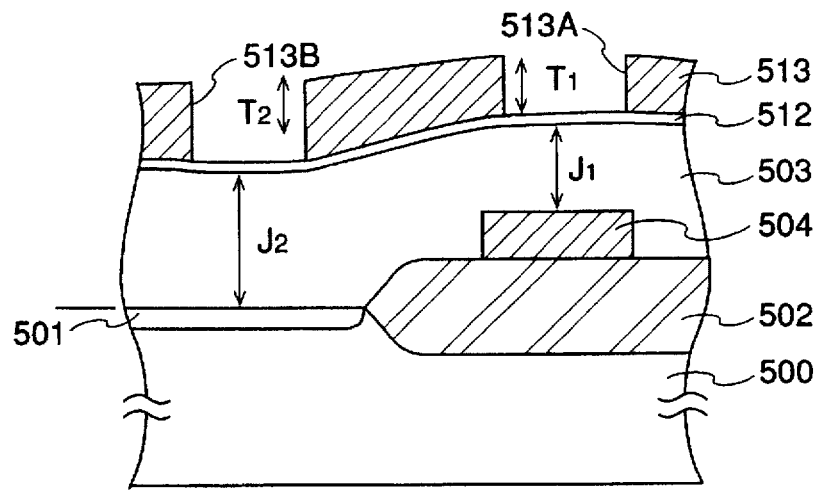
FIGS. 9A–9F are diagrams showing a fabrication process of a semiconductor device according to a third embodiment of the present invention.

Referring to FIG. 9A, an active region including a diffusion region 501 of the $n^+$-type is defined in a Si substrate 500 by a field oxide film 502 typically having a thickness of 400–500 nm. On the field oxide film 502, there is provided a polysilicon pattern 504 of the $n^+$-type doped by P, wherein the polysilicon pattern 504 forms a gate of a MOS transistor and has a thickness of 300 nm and a width of 180–350 nm. It should be noted that the diffusion region 501 is covered by a thin silicon oxide film acting as a gate insulation film of a MOS transistor.

The gate pattern 504 on the field oxide film 502 is buried under an interlayer insulation layer 503, wherein the interlayer insulation layer 503 includes a CVD-deposited silicon oxide layer (not shown) covering the pattern 504 and a planarization layer (not shown) of PSG or BPSG covering the silicon oxide layer. As a result of the field oxide film 502 and the gate pattern 504 thereon, the interlayer insulation layer 503 has a reduced thickness $J_1$ as compared with a thickness $J_2$ for the part of the layer 503 where the surface of the substrate 500 is flat. Similarly to the previous embodiments, the silicon oxide layer and the planarization layer are formed by a CVD process.

The interlayer insulation layer 503 in turn is covered by a SiN layer 512 with a thickness of 100 nm, and a photoresist 513 is deposited on the SiN layer 512 by a spin coating process. The photoresist 513 has a reduced thickness $T_1$ in correspondence to the region located above the conductor pattern 504 as compared with a thickness $T_2$ for the part covering the diffusion region 501, due to the elevated level of the SiN layer 512 on which the photoresist 513 is formed.

After the photoresist 513 is formed as such, openings 513A and 513B are formed in the photoresist 513 respectively in correspondence to the part located above the conductor pattern 504 and the part located above the diffusion region 501. In this process, the openings 513A and 513B are formed with a diameter of 0.48 μm and 0.5 μm respectively, which are substantially larger than the diameter of the minute contact hole to be formed in the layer 503. As the size of the openings 513A and 513B is sufficiently large as compared with the design rule applied to the semiconductor device, one can use an optical exposure system of relatively low resolution for the exposure of the openings 513A and 513B. As a low resolution optical exposure system has a large focal depth, the openings 513A and 513B formed at different levels can be exposed simultaneously without problem with regard to the focal depth and hence the exposure dose.

When a high resolution optical exposure system having a resolution corresponding to the design rule of the semiconductor device of 0.3 or 0.4 μm is used, it should be noted that simultaneous focusing of the optical beam for exposing the openings 513A and 513B in the photoresist 513 becomes extremely difficult or impossible at all due to the difference in the level between the opening 513A and the opening 513B. For example, when the optical beam is focused properly to the opening 513B, the exposure dose for the opening 513A becomes insufficient, or vice versa. In the present embodiment, the difference of 0.02 μm in the size between the opening 513A and the opening 513B is caused by such a difference in the exposure dose, while it will be noted that such a very small deviation in the size of the opening is safely ignorable.

Figure 9B:
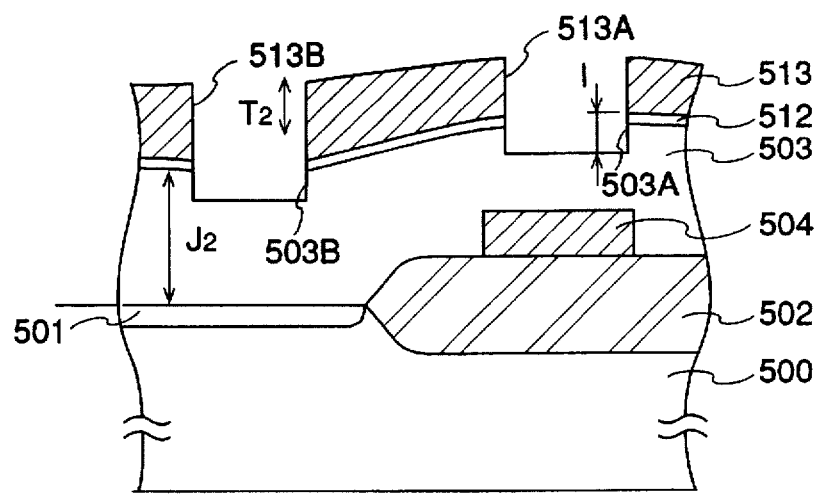

Next, in the step of FIG. 9B, the structure of FIG. 9A is incorporated into a reaction chamber of a dry etching apparatus that may have an ECR plasma source, and depressions 503A and 503B are formed in the insulation layer 503 respectively in correspondence to the foregoing openings 513A and 513B. The dry etching process is conducted by introducing a mixture of $C_4F_8$ and $O_2$ into the reaction chamber as an etching gas and by setting the condition such that an anisotropic etching acting in the direction substantially vertical to the substrate 500 occurs with substantially the same etching rate for the SiN layer 512 and the insulator layer 503. The etching is continued until the depressions 503A and 503B are formed with a depth I of about 300 nm. It should be noted that the depth I is set preferably smaller than one-half the thickness $J_2$ of the insulation layer 503. In correspondence to the openings 513A and 513B, the depressions 503A and 503B have the inner diameters of 0.50 μm and 0.48 μm respectively.

Figure 9C:
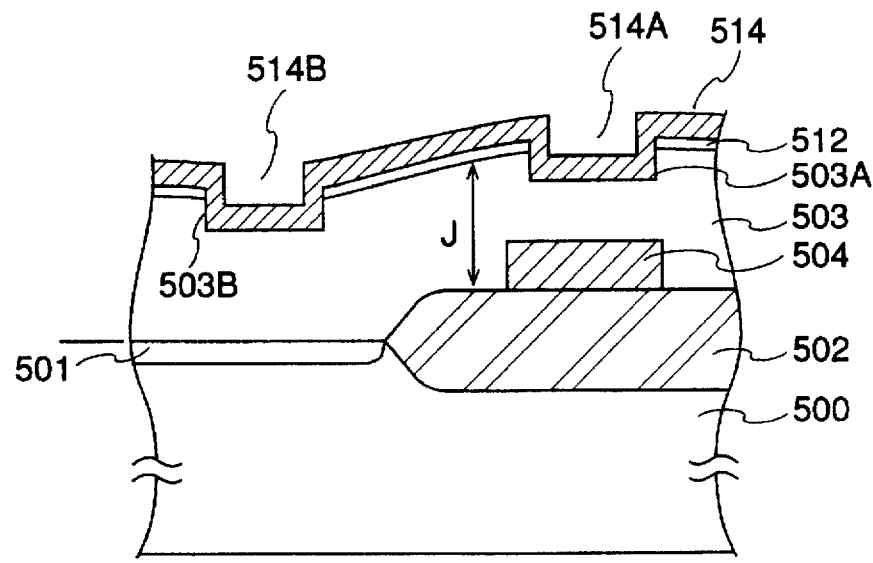

Next, in the step of FIG. 9C, the resist 513 is removed, and a layer 514 of W is deposited on the structure thus obtained by a plasma CVD process while using a mixture of $WF_6$ and $SiH_4$, such that the W layer 514 covers the depressions 503A and 503B with a thickness of 75 nm on the inner peripheral walls of the depressions 503A and 503B.

Figure 9D:
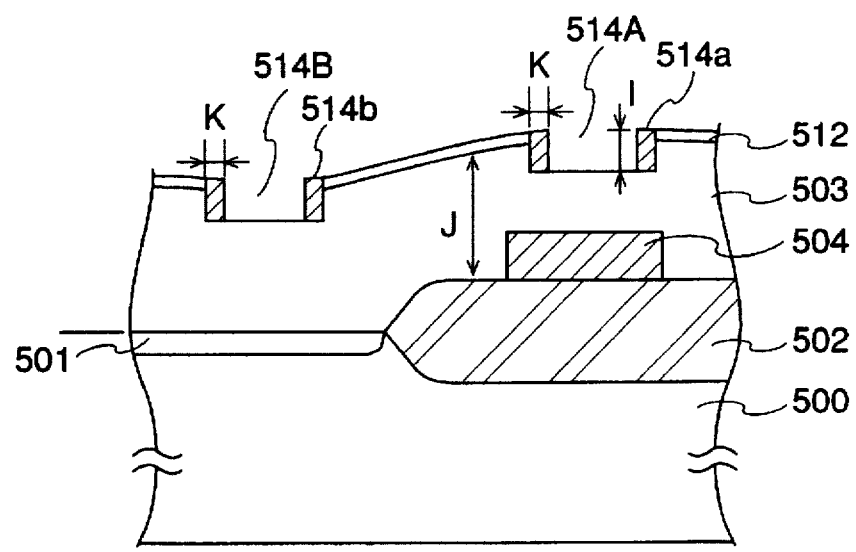

After the step of FIG. 9C, a dry etching process is applied to the W layer 514 by using $SF_6$ as an etching gas, such that an anisotropic etching occurs in the direction generally perpendicular to the principal surface of the substrate 500. As a result of the etching of the W layer 514, a structure shown in FIG. 9D is obtained, in which it will be noted that the depressions 514A and 514B have respective ring members 514a and 514b of W. A SEM observation was made for the ring members 514a and 514b in the state of FIG. 9D, and it was confirmed that both the ring members have an inner diameter of 0.35 μm corresponding to the design rule.

Figure 9E:
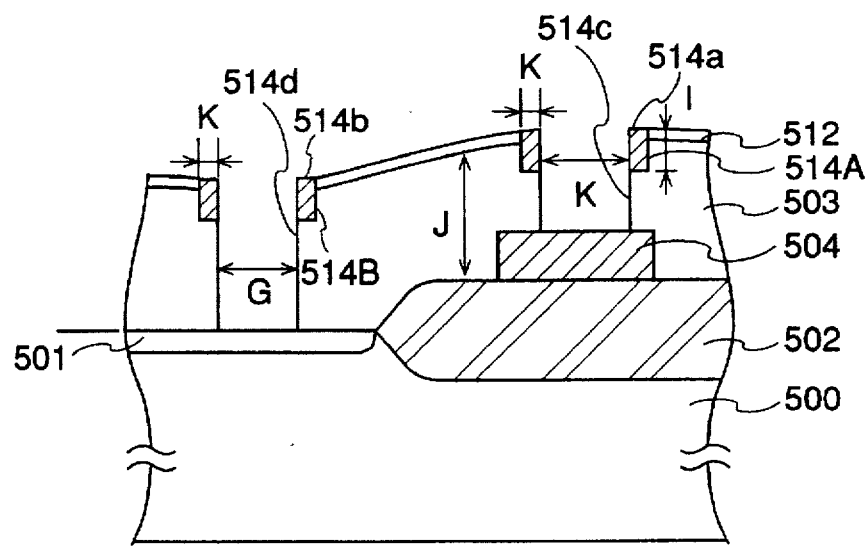

Next, in the step of FIG. 9E, an anisotropic dry etching process is applied to the insulation layer 503 while using a mixture of $C_4F_8$ and $O_2$ as an etching gas, such that the anisotropic etching process acts substantially vertically to the major surface of the substrate 500. Thereby, the W ring members 514a and 514b act as a mask, and contact holes 514c and 514d are formed respectively in correspondence to the foregoing depressions 514A and 514B, such that the contact hole 514c exposes the surface of the conductor pattern 504 and such that the contact hole 514d exposes the surface of the diffusion region 501.

After close examination of the contact holes 514c and 514d thus formed by a SEM, it was confirmed that the contact hole 514c has an inner diameter of 0.34 μm, while the contact hole 514d has an inner diameter of 0.35 μm which agrees exactly to the design rule. Thereby, it will be noted that the deviation in the size of the contact hole 514c from the design rule is only 0.01 μm.

Figure 9F:
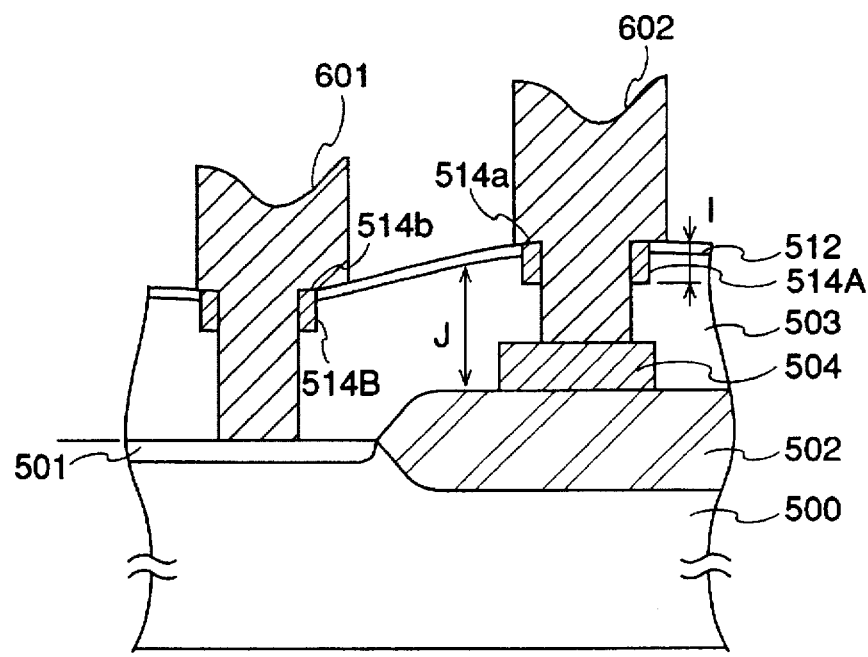

Next, in the step of FIG. 9F, upper layer electrodes such as electrodes 601 and 602 are provided so as to fill the contact holes 514c and 514d respectively, wherein the electrodes 601 and 602 are formed by sputtering Ti as a diffusion barrier, followed by a sputtering of a commonly used Al alloy containing Al and Si or Al and Cu, to form an electrode layer. The foregoing electrodes 601 and 602 are formed as a result of patterning of the electrode layer thus formed.

Similarly as before, the contact holes 514c and 514d thus formed have a smooth, circular inner surface free from irregularities such as the one shown in FIG. 2. Thereby, the problem of premature failure of the contact by the electromigration effect or stress migration effect is successfully eliminated.

Figure 10A:
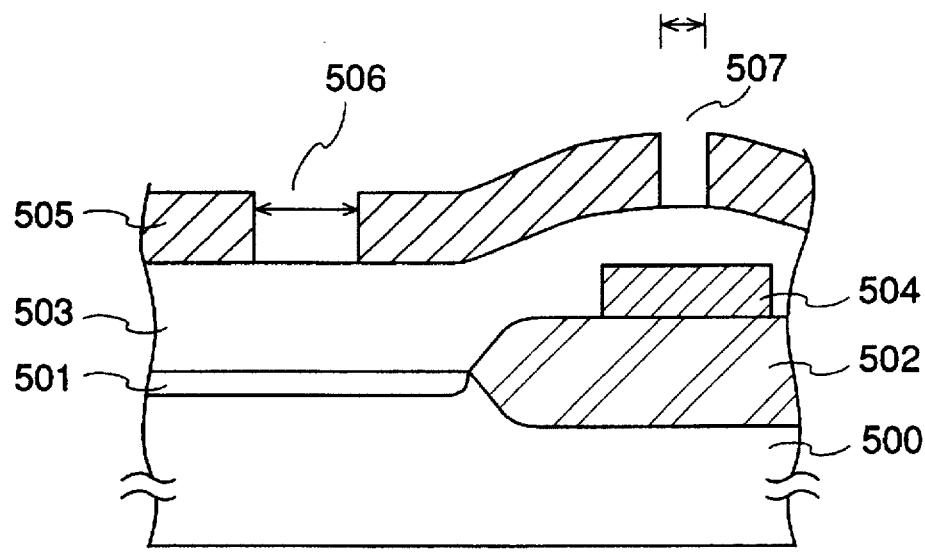
FIGS. 10A and 10B are diagrams showing a comparative example of fabricating a semiconductor device according to a conventional process.
Figure 10B:
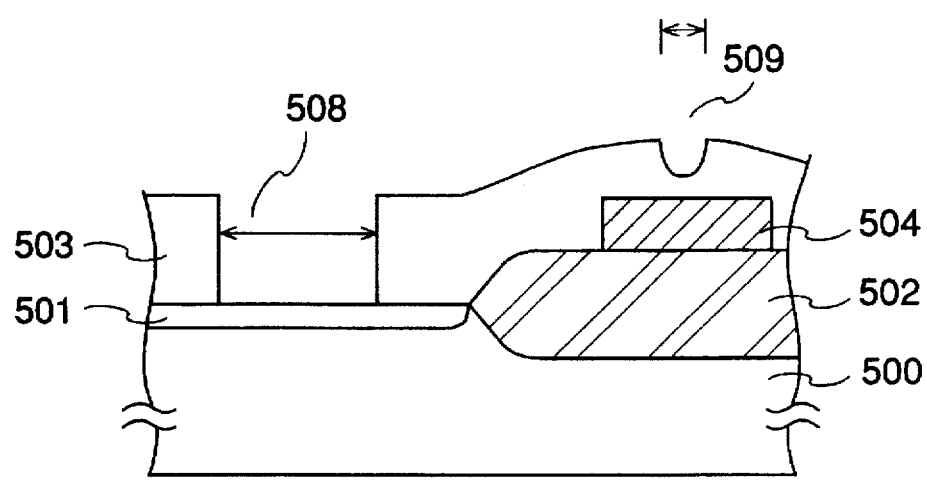

FIGS. 10A and 10B show the comparative experiments conducted for forming a similar contact structure without using the ring-member in the contact hole. In the drawings, those parts corresponding to the parts described already are designated by the same reference numerals and the description thereof will be omitted.

Referring to FIG. 10A, openings 506 and 507 are formed in the photoresist 505 by an optical exposure process respectively in correspondence to the diffusion region 501 and the conductor pattern 504, wherein the optical exposure process is conducted in accordance with the design rule of 0.35 μm by using a high resolution optical system characterized by a large numerical aperture.

As a result of such a high resolution optical exposure process, it was confirmed that the opening 506 is formed with a nominal inner diameter of 0.35 μm, while the opening 507 has an inner diameter of 0.20 μm, which is substantially smaller than the diameter of the opening 506. This clearly indicates the insufficient exposure dose for the opening 507 formed at an elevated level as compared with the opening 506.

After the structure of FIG. 10A is formed as such, an anisotropic etching process is applied generally vertically to the principal surface of the substrate 500 in a dry etching apparatus under the condition similar to the process of FIG. 9E to form contact holes 508 and 509 respectively in correspondence to the openings 506 and 507, wherein it was found, as a result of SEM analysis, that the contact hole 508 is formed with an inner diameter of 0.45 μm, indicating that a CD loss of about 0.1 μm has occurred. In the case of the contact hole 509, on the other hand, a CD loss of about 0.15 μm was observed. Further, the SEM analysis revealed that the contact hole 509 is not actually a through hole but is does not reach the conductor pattern 504. It is thus believed that there occurred an etching lag in the contact hole 509 because of the very small diameter of the resist opening 507 of 0.20 μm.

Figure 11:
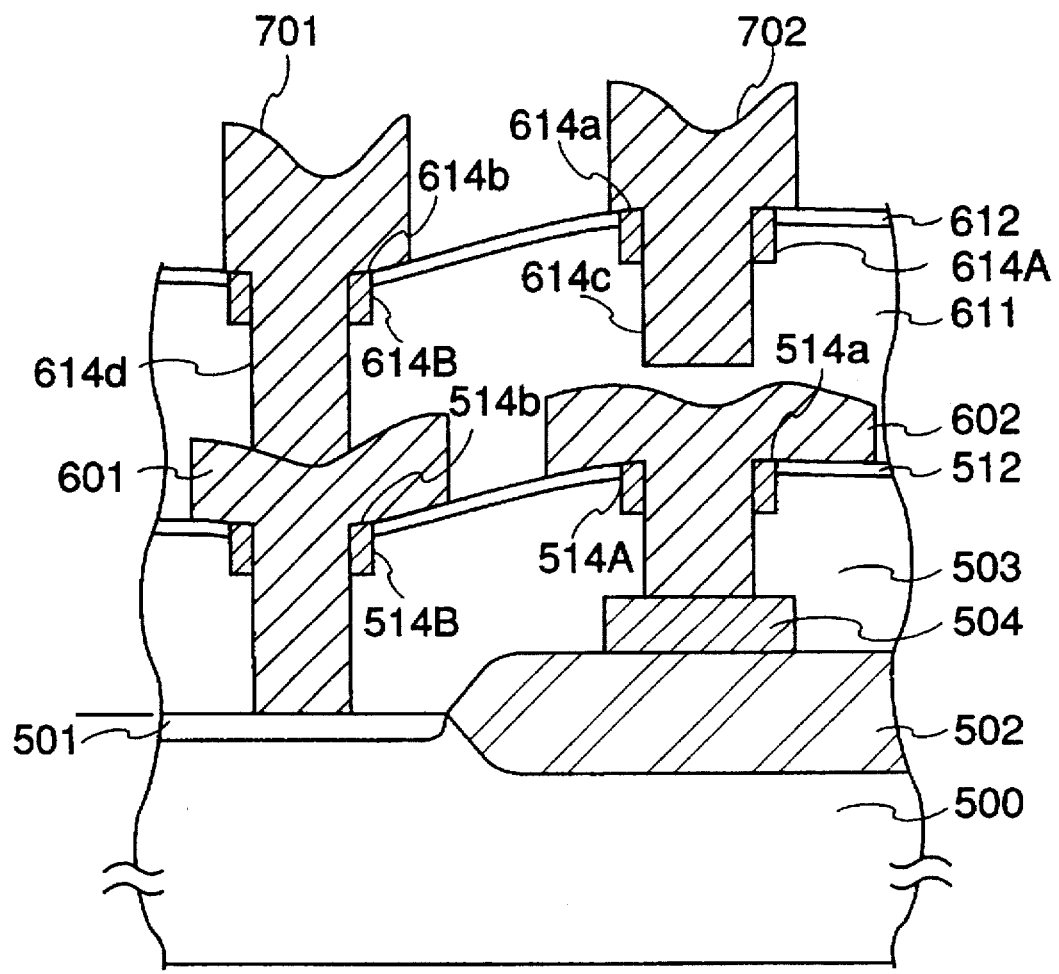
FIG. 11 is a diagram showing the construction of a semiconductor integrated circuit having a multi-layer interconnection structure according to a fourth embodiment of the present invention.

FIG. 11 shows a semiconductor integrated circuit having a multilayer interconnection structure, wherein those parts described previously are designated by the same reference numerals and the description thereof will be omitted.

Referring to FIG. 11, another insulation layer 611 having a similar construction as the insulation layer 503 is provided on the structure of FIG. 9F, wherein the insulation layer 611 is covered by a SiN layer 612 which is similar to the SiN layer 512. Further, depressions 614A and 614B are formed through the layers 612 and 611 respectively in correspondence to the depressions 514A and 514B. Further, W rings 614a and 614b are provided in the depressions 614A and 614B with an intimate contact to the respective side walls, and contact holes 614c and 614d are formed in correspondence to the contact holes 514c and 514d, wherein the contact hole 614c exposes the electrode 602, while the contact hole 614d exposes the electrode 601. The contact holes 614c and 614d are filled with respective electrodes 702 and 703, wherein the electrode 702 establishes an electric contact with the electrode 602 via the contact hole 614c, while the electrode 701 establishes an electric contact with the electrode 601 via the contact hole 614d.

In such a multilayer interconnection structure, there is a tendency that the projections and depressions formed on the substrate are enhanced as a result of accumulation of the projections and depressions of the layers stacked with each other. In such a multilayer interconnection structure, there is a tendency that a projection is formed on an underlying projection and a depression is formed on an underlying depression. Associated with such an enhanced projections and depressions, formation of the contact holes without a CD loss has been extremely difficult in the conventional processes. The present invention successfully avoids the problem of CD loss by using the ring member that shows a selectivity against etching.

Further, the present invention is by no means limited to the embodiments described heretofore, but various variations and modifications may be made without departing from the scope of the invention.

What is claimed:

1. A contact structure, comprising:

a conductive first layer;

a second layer of an insulating material provided on said first layer;

a third layer provided on said second layer;

a depression provided on said second and third layers so as to extend from a top surface of said third layer toward a bottom surface of said second layer, said depression having a bottom surface above said bottom surface of said second layer and below a bottom surface of said third layer, said depression being defined by a first inner peripheral wall having a first inner diameter and extending from said top surface of said third layer to said bottom surface of said depression, said first inner peripheral wall surrounding said depression continuously;

a through hole provided on said bottom surface of said depression generally at a center thereof, such that said through hole extends from said bottom surface of said depression to said bottom surface of said second layer, said through hole thereby exposing a top surface of said first layer and being defined by a second inner periphery having a second inner diameter substantially smaller than said first inner diameter;

a ring-shaped wall member fitted in said depression so as to form an intimate contact with said first inner peripheral wall of said depression, said ring-shaped wall member being thereby defined by a third inner peripheral wall having a third inner diameter substantially identical to said second inner diameter of said through hole, said third layer being formed of an inorganic insulating material that shows a resistance to a dry etching process with respect to said material forming said second layer, said ring-shaped wall member being formed of an inorganic material that shows a selectivity to a dry etching process with respect to said material forming said second layer.

2. A contact structure as claimed in claim 1, wherein said ring-shaped wall member has a resistance substantially exceeding a resistance of said first layer.

3. A contact structure as claimed in claim 1 wherein said ring-shaped wall member comprises an undoped polysilicon.

4. A contact structure as claimed in claim 1 wherein said ring-shaped wall member comprises polysilicon doped with a deep impurity.

5. A contact structure as claimed in claim 1, further comprising a semiconductor material of a first conductivity type filling said ring-shaped member and said through hole, wherein said ring-shaped member has a second, opposite conductivity type.

6. A semiconductor device, comprising:

a semiconductor substrate;

a conductive first layer provided on said semiconductor substrate;

a second layer of an insulating material provided on said first layer;

a third layer provided on said second layer;

a depression provided on said second and third layers so as to extend from a top surface of said third layer toward a bottom surface of said second layer, said depression having a bottom surface above said bottom surface of said second layer and below a bottom surface of said third layer, said depression being defined by a first inner peripheral wall having a first inner diameter and extending from said top surface of said third layer to said bottom surface of said depression, said first inner peripheral wall surrounding said depression continuously;

a through hole provided on said bottom surface of said depression generally at a center thereof, such that said through hole extends from said bottom surface of said depression to said bottom surface of said second layer, said through hole thereby exposing a top surface of said first layer and being defined by a second inner periphery having a second inner diameter substantially smaller than said first inner diameter;

a ring-shaped wall member fitted in said depression so as to form an intimate contact with said first inner peripheral wall of said depression, said ring-shaped wall member thereby defining an inner space by a third inner peripheral wall having a third inner diameter substantially identical to said second inner diameter of said through hole; and an electrode filling said through hole and said inner space of said ring-shaped wall member in an intimate contact with said conductive first layer, said third layer being formed of an inorganic insulating material that shows a resistance to a dry etching process with respect to said material forming said second layer, said ring-shaped wall member being formed of an inorganic material that shows a selectivity to a dry etching process with respect to said material forming said second layer.

7. A semiconductor device as claimed in claim 6, wherein said ring-shaped wall member has a resistance substantially exceeding a resistance of said electrode.

8. A semiconductor device as claimed in claim 6 wherein said ring-shaped wall member comprises an undoped polysilicon.

9. A semiconductor device as claimed in claim 6 wherein said ring-shaped wall member comprises polysilicon doped with a deep impurity.

10. A semiconductor device as claimed in claim 6, wherein said electrode comprises a semiconductor material of a first conductivity type, and wherein said ring-shaped wall member comprises a semiconductor material having a second, opposite conductivity type.

11. A semiconductor device as claimed in claim 6, wherein said first layer comprises a diffusion region formed in said semiconductor substrate.

12. A semiconductor device as claimed in claim 6, wherein said first layer comprises a conductor pattern provided on said semiconductor substrate.

13. A semiconductor device, comprising:

a semiconductor substrate having a surface structure, said surface structure including a first region having a first level and a second region having a second, elevated level;

a first conductive layer provided on said first region of said semiconductor substrate;

a second conductive layer provided on said second region of said semiconductor substrate;

a first insulating layer provided on said surface structure of said semiconductor substrate so as to bury said first and second conductive layers underneath;

a second insulating layer provided on said second layer so as to cover said first and second regions;

a first depression provided on said first and second insulating layers in correspondence to said first region so as to extend from a top surface of said second insulating layer toward a bottom surface of said first insulating layer, said depression having a bottom surface above said bottom surface of said first insulating layer and below a bottom surface of said second insulating layer in said first region, said first depression being defined by a first inner peripheral wall having a first inner diameter and extending from said top surface of said second insulating layer to said bottom surface of said first depression;

a first through hole provided on said bottom surface of said first depression generally at a center thereof, such that said first through hole extends from said bottom surface of said first depression to said bottom surface of said first insulating layer, said first through hole thereby exposing a top surface of said first conductive layer and being defined by a second inner peripheral wall having a second inner diameter substantially smaller than said first inner diameter, said second inner peripheral wall surrounding said depression continuously;

a first ring-shaped wall member fitted in said first depression so as to form an intimate contact with said first inner peripheral wall of said first depression, said first ring-shaped wall member being thereby defined by a third inner peripheral wall having a third inner diameter substantially identical to said second inner diameter of said first through hole, a second depression provided on said first and second insulating layers in correspondence to said second region so as to extend from a top surface of said second insulating layer toward a bottom surface of said first insulating layer, said depression having a bottom surface above said bottom surface of said first insulating layer and below a bottom surface of said second insulating layer in said second region, said second depression being defined by a fourth inner peripheral wall having a fourth inner diameter and extending from said top surface of said second insulating layer to said bottom surface of said second depression;

a second through hole provided on said bottom surface of said second depression generally at a center thereof, such that said second through hole extends from said bottom surface of said second depression to said bottom surface of said first insulating layer, said second through hole thereby exposing a top surface of said second conductive layer and being defined by a fifth inner peripheral wall having a fifth inner diameter substantially smaller than said fourth inner diameter, said fifth inner peripheral wall surrounding said depression continuously;

a second ring-shaped wall member fitted in said second depression so as to form an intimate contact with said fifth inner peripheral wall of said second depression, said second ring-shaped wall member being thereby defined by a sixth inner peripheral wall having a sixth inner diameter substantially identical to said fifth inner diameter of said second through hole;

a first electrode filling said first ring-shaped wall member and said first through hole in an intimate contact with said first conductive layer; and a second electrode filling said second ring-shaped wall member and said second through hole in an intimate contact with said second conductive layer;

said second insulating layer being formed of an inorganic insulating material that shows a resistance to a dry etching process with respect to said material forming said first insulating layer, said first and second ring-shaped wall members being formed of an inorganic material that shows a resistance to a dry etching process with respect to said material forming said first insulating layer, both of said second inner diameter of said first through hole and said fourth inner diameter of said second through hole being of a submicron size and agreeing within a deviation of less than 0.1 μm, said first ring-shaped wall member having a resistance substantially exceeding a resistance of said first electrode, said second ring-shaped wall member having a resistance substantially exceeding a resistance of said second electrode.

14. A semiconductor device as claimed in claim 13, wherein said deviation between said second inner diameter and said fourth inner diameter is less than about 0.01 μm.

15. A semiconductor device as claimed in claim 14, wherein said first conductive layer includes a diffusion region formed in said semiconductor substrate, and said second conductive layer includes a conductor pattern provided on a field oxide film provided on said semiconductor substrate.

16. A semiconductor integrated circuit, comprising:

a semiconductor substrate;

a plurality of semiconductor devices provided commonly on said semiconductor substrate, each of said semiconductor devices comprising:

a conductive first layer provided on said semiconductor substrate;

a second layer of an insulating material provided on said first layer;

a third layer provided on said second layer;

a depression provided on said second and third layers so as to extend from a top surface of said third layer toward a bottom surface of said second layer, said depression having a bottom surface above said bottom surface of said second layer and below a bottom surface of said third layer, said depression being defined by a first inner peripheral wall having a first inner diameter and extending from said top surface of said third layer to said bottom surface of said depression, said first inner peripheral wall surrounding said depression continuously;

a through hole provided on said bottom surface of said depression generally at a center thereof, such that said through hole extends from said bottom surface of said depression to said bottom surface of said second layer, said through hole thereby exposing a top surface of said first layer and being defined by a second inner periphery having a second inner diameter substantially smaller than said first inner diameter;

a ring-shaped wall member fitted in said depression so as to form an intimate contact with said first inner peripheral wall of said depression, said ring-shaped wall member being thereby defined by a third inner peripheral wall having a third inner diameter substantially identical to said second inner diameter of said through hole; and an electrode filling said ring-shaped wall member and said through hole in an intimate contact with said first layer;

said third layer being formed of an inorganic insulating material that shows a resistance to a dry etching process with respect to said material forming said second layer, said ring-shaped wall member being formed of an inorganic material that shows a resistance to a dry etching process with respect to said material forming said second layer;

said ring-shaped wall member having a resistance substantially larger than a resistance of said first layer.

17. A semiconductor integrated circuit as claimed in claim 16, wherein said semiconductor integrated circuit further comprises an multilayer interconnection structure, said multilayer interconnection structure comprising, in each of said semiconductor devices:

an interconnection pattern provided on said third layer in electric connection with said electrode;

a fourth layer of an insulating material provided on said third layer so as to bury said interconnection pattern underneath;

a fifth layer provided on said second layer;

a second depression provided on said fourth and fifth layers so as to extend from a top surface of said fifth layer toward a bottom surface of said fourth layer, said second depression having a bottom surface above said bottom surface of said fourth layer and below a bottom surface of said fifth layer, said second depression being defined by a first inner peripheral wall having a first inner diameter and extending from said top surface of said fifth layer to said bottom surface of said second depression;

a second through hole provided on said bottom surface of said second depression generally at a center thereof, such that said second through hole extends from said bottom surface of said second depression to said bottom surface of said fourth layer, said through hole thereby exposing a top surface of said interconnection pattern and being defined by a second inner periphery having a second inner diameter substantially smaller than said first inner diameter of said second depression;

a second ring-shaped wall member fitted in said second depression so as to form an intimate contact with said first inner peripheral wall of said second depression, said second ring-shaped wall member being thereby defined by a third inner peripheral wall having a third inner diameter substantially identical to said second inner diameter of said second through hole; and an upper electrode filling said second ring-shaped wall member and said second through hole in an intimate contact with said interconnection pattern;

said fifth layer being formed of an inorganic insulating material that shows a selectivity to a dry etching process with respect to said material forming said fourth layer, said second ring-shaped wall member being formed of an inorganic material that shows a selectivity to a dry etching process with respect to said material forming said second layer.

* * * * *